United States Patent
Agno et al.

(10) Patent No.: US 8,492,887 B2
(45) Date of Patent: Jul. 23, 2013

(54) INTEGRATED CIRCUIT PACKAGING SYSTEM WITH LEADFRAME AND METHOD OF MANUFACTURE THEREOF

(75) Inventors: Jayby Agno, Singapore (SG); Erwin Aguas Sangalang, Singapore (SG); Dexter Anonuevo, Singapore (SG); Ramona Damalerio, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 320 days.

(21) Appl. No.: 12/731,472

(22) Filed: Mar. 25, 2010

(65) Prior Publication Data

US 2011/0233743 A1  Sep. 29, 2011

(51) Int. Cl.
*H01L 23/28* (2006.01)
*H01L 21/60* (2006.01)
*H01L 23/495* (2006.01)

(52) U.S. Cl.
USPC ............ 257/690; 257/E21.506; 257/E23.124; 438/124

(58) Field of Classification Search
None
See application file for complete search history.

(56) References Cited

U.S. PATENT DOCUMENTS

| | | | |
|---|---|---|---|
| 5,637,913 A | 6/1997 | Kajihara et al. | |
| 5,847,446 A | 12/1998 | Park et al. | |
| 6,838,753 B2 | 1/2005 | Lee et al. | |
| 7,521,294 B2 | 4/2009 | Lee | |
| 2002/0105063 A1* | 8/2002 | Huat et al. | 257/669 |
| 2005/0133893 A1* | 6/2005 | Joshi et al. | 257/676 |
| 2008/0194060 A1* | 8/2008 | Shimanuki | 438/114 |

OTHER PUBLICATIONS

McShane, M.; Casto, J.; Bigler, J.; Lin, P.; , "Low profile plastic quad flat package: LPPQFP," Electronics Components Conference, 1988., Proceedings of the 38th , vol., no., pp. 411-419, May 9-11, 1988.*
Semmens J. et. al. "Evalutaion of thin plastic packages using acoustin micro imaging" Aug. 1996 retrieved from URL <http://www.sonoscan.com/images/53PEMThinSemiTest96.pdf>.*
McShane, M.; Casto, J.; Bigler, J.; Lin, P., "Low profile plastic quad flat package: LPPQFP," Proceedings of the 38th Electronics Components Conference, pp. 411-419, May 9-11, 1988.*

* cited by examiner

*Primary Examiner* — Thomas L Dickey
*Assistant Examiner* — Joseph Schoenholtz
(74) *Attorney, Agent, or Firm* — Ishimaru & Associates LLP

(57) ABSTRACT

A method of manufacture of an integrated circuit packaging system includes: providing a leadframe strip system, having a stress relief slot and a leadframe unit, the stress relief slot is at a frame corner of the leadframe strip system and spans adjacent sides of the leadframe unit, the leadframe unit includes a paddle, a tie bar therefrom, and a lead finger; connecting an integrated circuit and the lead finger; forming an encapsulation covering the integrated circuit; and singulating the integrated circuit in the encapsulation from the leadframe strip system with a package corner of the encapsulation free of micro-cracks with an inspection of the package corner at least 50x view.

17 Claims, 7 Drawing Sheets

INTEGRATED CIRCUIT PACKAGING SYSTEM WITH LEADFRAME AND METHOD OF MANUFACTURE THEREOF

TECHNICAL FIELD

The present invention relates generally to an integrated circuit packaging system, and more particularly to a system for an integrated circuit packaging system with leadframe.

BACKGROUND ART

Integrated circuits are used in many portable electronic products, such as cell phone, portable computers, voice recorders, etc. as well as in many larger electronic systems, such as cars, planes, industrial control systems, etc. Across virtually all applications, there continues to be demand for reducing the size and increasing performance of the devices. The intense demand is no more visible than in portable electronics that have become so ubiquitous.

As electronic devices have become smaller and thinner, the packages for protecting and interconnecting IC chips particularly power IC have the same trend, too.

The goals in designing and manufacturing semiconductor devices have been to make the devices smaller, more complex, with higher densities, and to include additional features. One method that improves the features and the densities of the semiconductor devices is to shrink the line sizes used in the lithographic process step in fabricating semiconductor devices. For example, each one-half reduction in line width of the circuits of the semiconductor device corresponds to a four-fold increase in chip density for the same size device.

Unfortunately, increasing density simply through improved lithographic techniques is limited because of physical limits and the cost factor of scaling down the dimensions of the semiconductor device. Accordingly, many attempts to increase semiconductor device density have been pursued. One such alternative has been the stacking of multiple semiconductor devices.

Thus, a need still remains for an integrated circuit packaging system providing increasing density without sacrificing reliability, yield, and high volume manufacturing processes. In view of the ever-increasing need to increase density of integrated circuits and particularly portable electronic products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a leadframe strip system, having a stress relief slot and a leadframe unit, the stress relief slot is at a frame corner of the leadframe strip system and spans adjacent sides of the leadframe unit, the leadframe unit includes a paddle, a tie bar therefrom, and a lead finger; connecting an integrated circuit and the lead finger; forming an encapsulation covering the integrated circuit; and singulating the integrated circuit in the encapsulation from the leadframe strip system with a package corner of the encapsulation free of micro-cracks with an inspection of the package corner at least 50× view.

The present invention provides a method of manufacture of a leadframe strip system including: forming a leadframe unit at a frame corner, the leadframe unit includes a paddle, a tie bar extending therefrom, and a lead finger; and forming a stress relief slot at the frame corner, the stress relief slot spans adjacent sides of the leadframe unit.

The present invention provides an integrated circuit packaging system, including: an integrated circuit connected to a lead finger; and an encapsulation covering the integrated circuit, the encapsulation having a package corner, the package corner having characteristic of being molded with a stress relief slot at a frame corner of a leadframe strip system and spans adjacent sides of a leadframe unit, the leadframe unit includes a paddle, a tie bar therefrom, and the lead finger, and the package corner free of micro-cracks with an inspection of the package corner at least 50× view.

The present invention provides a leadframe strip system, including: a leadframe unit at a frame corner, the leadframe unit includes a paddle, a tie bar extending therefrom, and a lead finger; and a stress relief slot at the frame corner, the stress relief slot spans adjacent sides of the leadframe unit.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
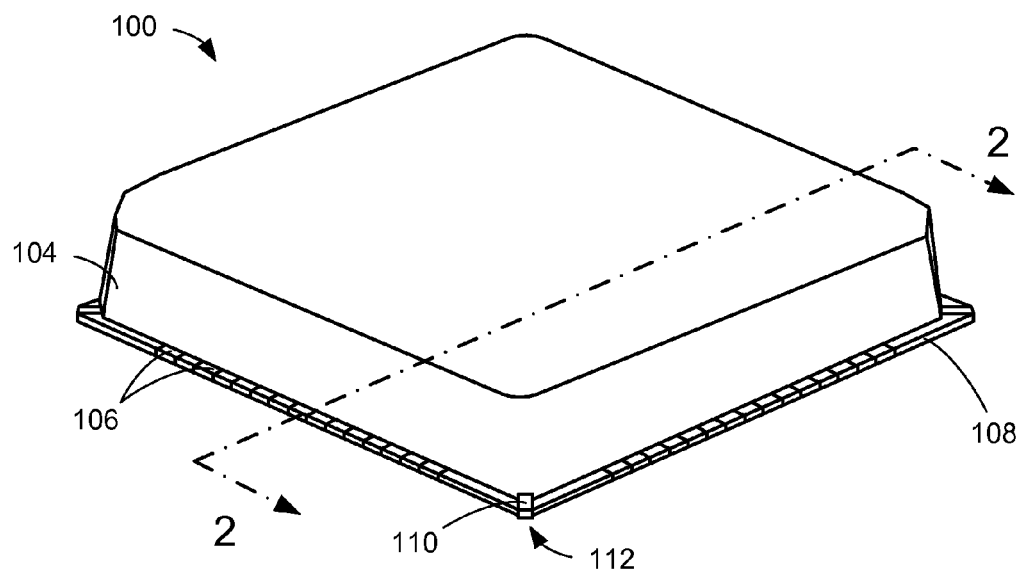
FIG. 1 is an isometric view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "processing" as used herein includes deposition of material or photoresist, patterning, exposure, development, etching, cleaning, and/or removal of the material or photoresist as required in forming a described structure.

Referring now to FIG. 1, therein is shown an isometric view of an integrated circuit packaging system 100 in a first embodiment of the present invention. The top view depicts an encapsulation 104, such as a cover including an epoxy molding compound. Leads 106 can be exposed from the encapsulation 104 at sides 108 of the integrated circuit packaging system 100. Corner terminals 110 can be exposed from the encapsulation 104 at a package corner 112 of the integrated circuit packaging system 100.

Figure 2:
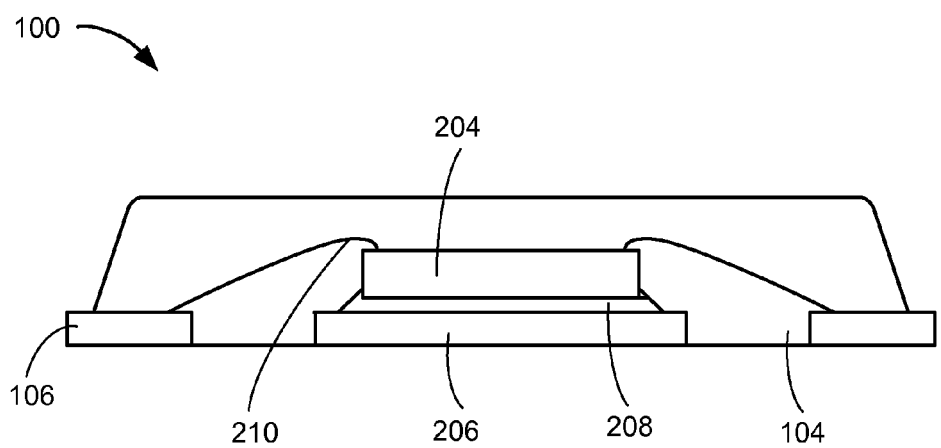
FIG. 2 is a cross-sectional view of the integrated circuit packaging system along line 2-2 of FIG. 1.

Referring now to FIG. 2, therein is shown a cross-sectional view of the integrated circuit packaging system 100 along line 2-2 of FIG. 1. The cross-sectional view depicts an integrated circuit 204, such as an integrated circuit die or wafer scale chip, mounted over a paddle 206, such as a die-attach paddle, with an adhesive 208, such as a die-attach adhesive or thermal adhesive.

Internal interconnects 210, such as bond wires or ribbon bond wires, can connect the integrated circuit 204 with the leads 106.

The encapsulation 104 can be over the integrated circuit 204 and the internal interconnects 210. For illustrative purposes, the integrated circuit packaging system 100 is shown with the paddle 206 exposed from the encapsulation 104, although it is understood that the encapsulation 104 may not expose the paddle 206.

Figure 3:
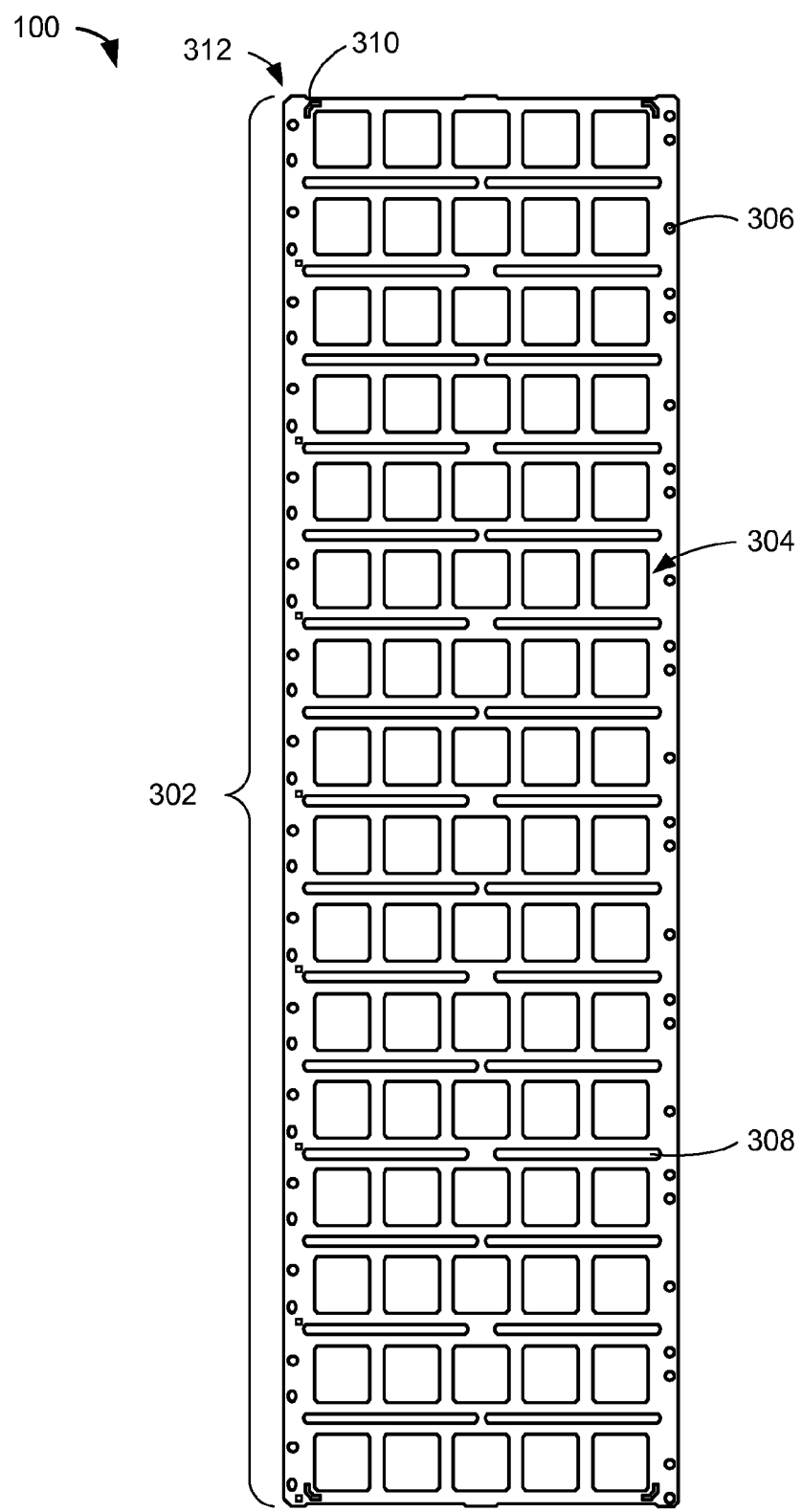
FIG. 3 is a top view of the integrated circuit packaging system of FIG. 1 in a manufacturing phase with a leadframe strip system.

Referring now to FIG. 3, therein is shown a top view of the integrated circuit packaging system 100 of FIG. 1 in a manufacturing phase with a leadframe strip system 302. The integrated circuit packaging system 100 can represent a configuration of Quad Flat No-Lead (QFN) packages, Very Thin QFN Punch Singulated (VQFNp) packages, VQFNp Dual-Row (VQFNp-dr) packages, high density packages, packages with leadframes, or any other packaging systems having frame corner slotting or relief structure near the leadframe frame corners.

The leadframe strip system 302, which can include a sheet of metal or conductive material that can be formed by etching, stamping, cutting, chemical milling, or a combination thereof. The leadframe strip system 302 can include an area array of leadframe units 304 that are used for manufacturing the integrated circuit packaging system 100.

The leadframe strip system 302 can include any number of the leadframe units 304. One of the leadframe units 304 can be formed abutting or adjacent another of the leadframe units 304 in the area array.

The leadframe strip system 302 can include any number of holes 306 formed along sides of the leadframe strip system 302. The leadframe strip system 302 can include an inter-unit slot 308 formed between the leadframe units 304. The inter-unit slot 308 is formed spanning across more than one of the leadframe units 304.

The leadframe strip system 302 can include stress relief slots 310 that are defined as a slot, a hole, or an aperture formed through the leadframe strip system 302. The stress relief slots 310 can be formed near or at a frame corner 312 of the leadframe strip system 302. The stress relief slots 310 can be formed adjacent one of the leadframe units 304 that is formed near or at the frame corner 312, preventing microcracking or cracking problems due to outside stress or external force exerted or applied to the leadframe units 304.

Figure 4:
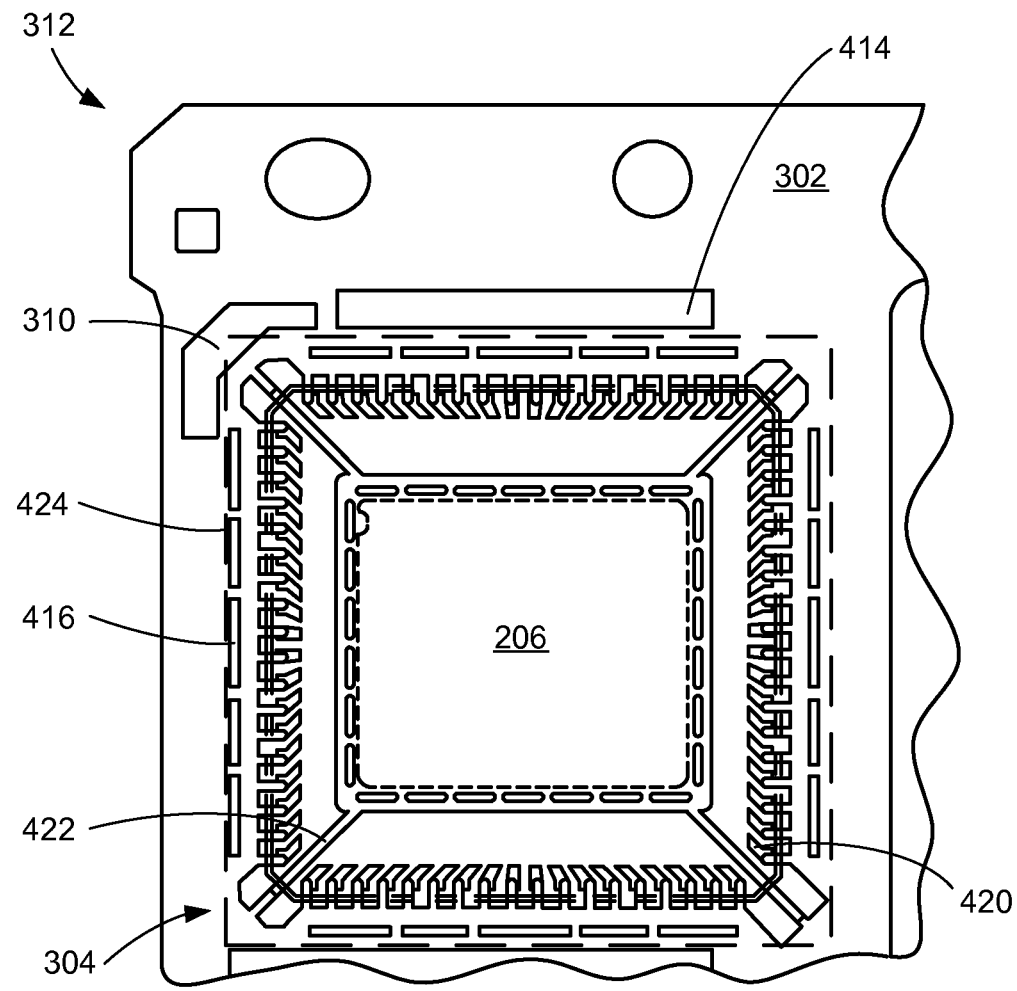
FIG. 4 is a detailed view of a corner portion of the leadframe strip system of FIG. 3.

Referring now to FIG. 4, therein is shown a detailed view of a corner portion of the leadframe strip system 302 of FIG. 3. The detailed view depicts one of the leadframe units 304 at the frame corner 312. The leadframe strip system 302 can include the stress relief slots 310 formed adjacent one of the leadframe units 304 that is formed near or at the frame corner 312.

The leadframe strip system 302 can include an outer slot 414 formed the stress relief slots 310. The leadframe strip system 302 can include any number of the outer slot 414. The outer slot 414 is constrained within the span of only one of the leadframe units 304.

The leadframe strip system 302 can include an inner slot 416 formed adjacent the stress relief slots 310 and the outer slot 414. The leadframe strip system 302 can include any number of the inner slot 416.

Each of the leadframe units 304 can be depicted by the long dashed line rectangle. Each of the leadframe units 304 can include the paddle 206 and lead fingers 420 beyond the perimeter of the paddle 206. The paddle 206 can be mechanically secured by tie bars 422 of the leadframe units 304. Each of the leadframe units 304 can also include the inner slot 416, the tie bars 422, and the lead fingers 420.

The stress relief slots 310 can be formed extending beyond sides 424 of the leadframe units 304. In this example, one of the stress relief slots 310 extends around two of the sides 424 adjacent to each other. Also for this example, one of the stress relief slots 310 is between the one of the leadframe units 304 and the frame corner 312.

Figure 5:
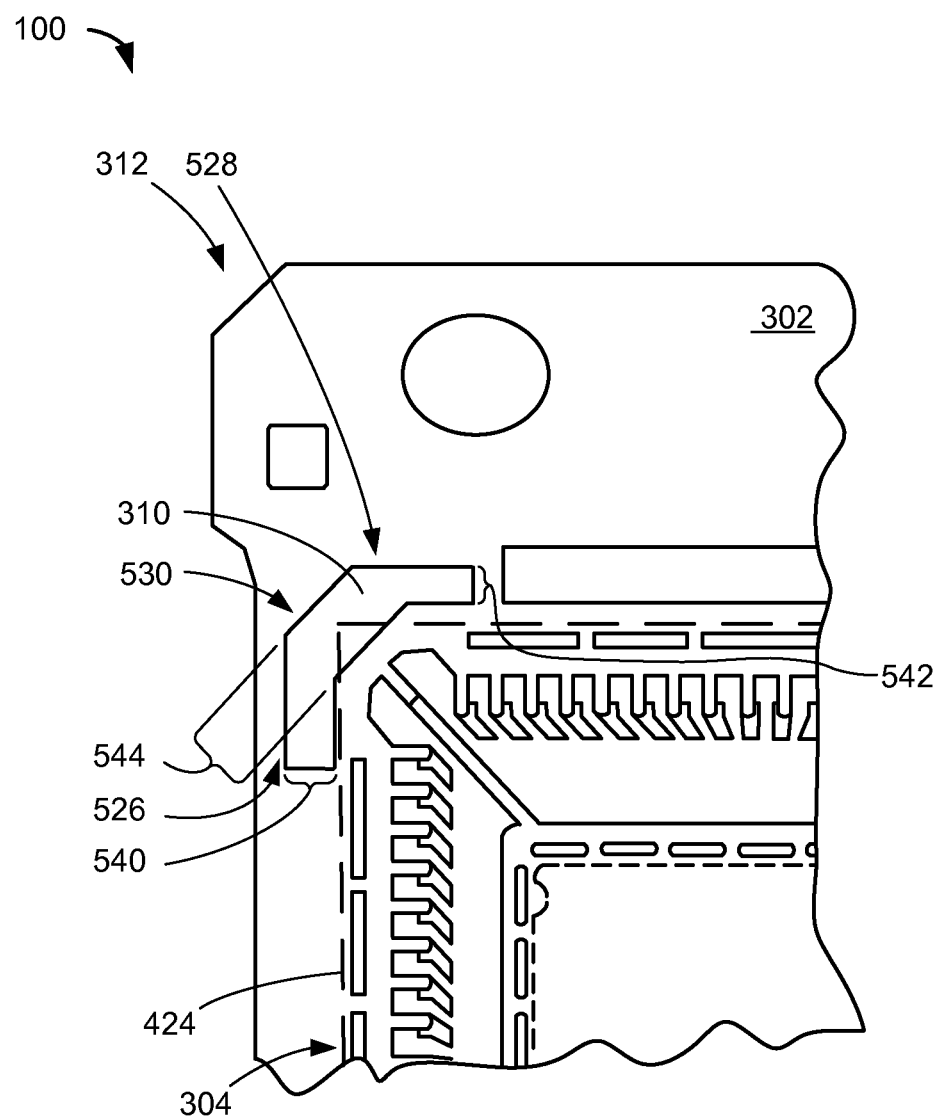
FIG. 5 is a more detailed view of one of the stress relief slots of FIG. 4.

Referring now to FIG. 5, therein is shown a more detailed view of one of the stress relief slots 310 of FIG. 4. Each of the stress relief slots 310 can include a first leg 526 and a second leg 528 with an abutment portion 530 in between.

In this example, the example of the stress relief slots 310 is shown in a segmented arc configuration where the first leg 526, the second leg 528, and the abutment portion 530 represent the segments. The first leg 526 and the second leg 528 can be parallel to sides 424 of the leadframe units 304. The abutment portion 530 can intersect two of the sides 424 that are adjacent to each other.

The first leg 526, the second leg 528, and the abutment portion 530 can have a first leg width 540, a second leg width 542, and an abutment width 544, respectively. In this example, the first leg width 540, the second leg width 542, and the abutment width 544 are not all equal. At least one of the first leg width 540, the second leg width 542, and the abutment width 544 differs from another.

It has been discovered that the present invention provides the integrated circuit packaging system 100 with improved reliability. The stress relief slots 310 at the frame corner 312 relieves external stress induced at or near the frame corner 312 of the leadframe strip system 302 that typically results in micro-cracking or cracking at the package corner 112 of FIG. 1. The micro-cracking or cracking at the package corner 112 results from bending through manual handling, inspection, and transferring, as examples, the leadframe strip system 302. The micro-cracking or cracking at the package corner 112 can also be a result of mechanical forces or outside stress induced or applied to the leadframes during processing from mold stations to singulation stations, which can include processing of molding or post-mold curing (PMC), deflashing, plating, annealing, laser marking, or singulation. The stress relief slots 310 dissipates these external forces away from the package corner 112 resulting in zero package crack occurrences based on inspection, evaluation, and no issues noted on tooling of end of line (EOL) processes. This elimination of micro-cracks or cracks at the package corner 112, as observed by 50× microscope or higher magnification microscope, improves reliability because the micro-cracks or cracks cannot be a starting point for delamination of the encapsulation 104 of FIG. 1.

Figure 6:
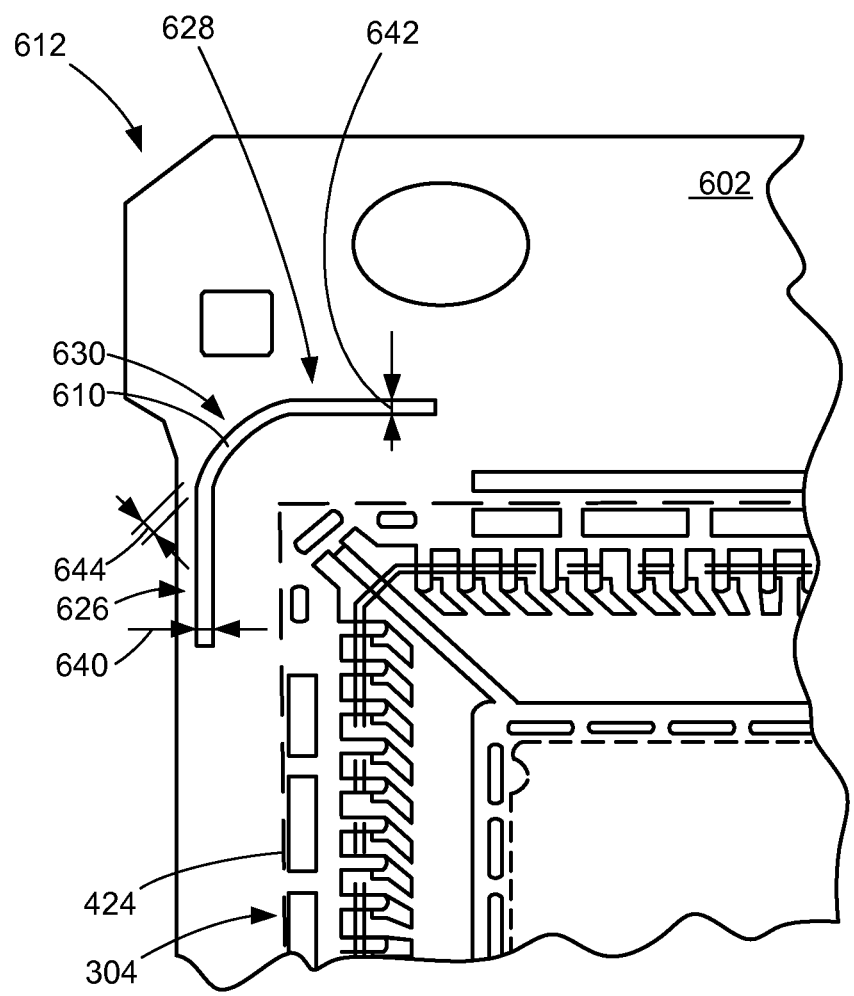
FIG. 6 is a more detailed view of stress relief slots similar to those of FIG. 4 in a second embodiment of the present invention.

Referring now to FIG. 6, therein is shown a more detailed view of stress relief slots 610 similar to those of FIG. 4 in a second embodiment of the present invention. A leadframe strip system 602 is similar in structure to the leadframe strip system 302 of FIG. 3. The leadframe strip system 602 can also be used to form the integrated circuit packaging system 100 of FIG. 1. Elements with the same name have the same attribute as in the leadframe strip system 302 of FIG. 3 unless explicitly described differently below or in the drawings.

Each of the stress relief slots 610 can include a first leg 626 and a second leg 628 with a curved portion 630 in between. In this example, the example of the stress relief slots 610 is shown in a curved arc configuration where the first leg 626 and the second leg 628 are at the ends of the arc, and the curved portion 630 provides the curvature for the curved arc configuration. The first leg 626 and the second leg 628 can be parallel to sides 424 of leadframe units 304. The curved portion 630 can intersect two of the sides 424 that are adjacent to each other.

The first leg 626, the second leg 628, and the curved portion 630 can have a first leg width 640, a second leg width 642, and a curved portion width 644, respectively. As an example, the first leg width 640 can be equal to the second leg width 642. The curved portion width 644 can be equal to the first leg width 640.

It has also been discovered that the present invention provides the integrated circuit packaging system 100 with improved reliability. The stress relief slots 610 at a frame corner 612 relieves external stress induced at or near the frame corner 612 of the leadframe strip system 602 that typically results in micro-cracking or cracking at the package corner 112 of FIG. 1. The curved portion 630 provides an option for gradual flow of the molding compound that forms the encapsulation 104 of FIG. 4. This gradual flow mitigates or eliminates build up and possible void in the molding compound during the molding process, which is another potential problem for future delamination that would degrade the package reliability.

Figure 7:
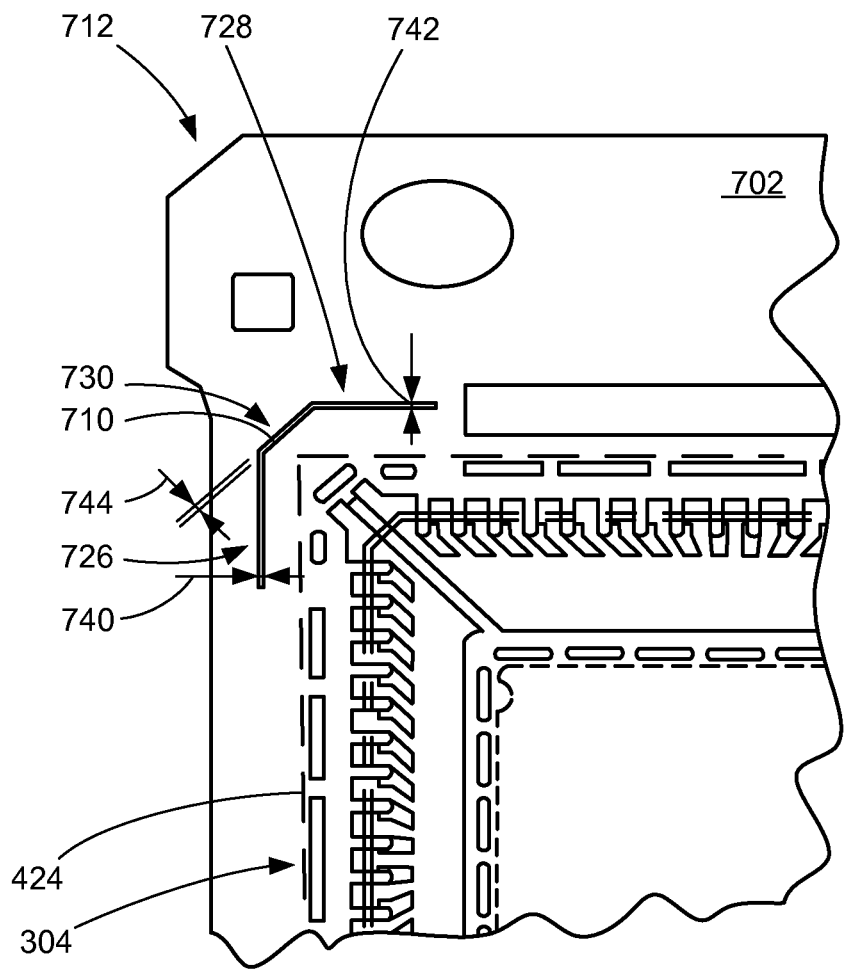
FIG. 7 is a more detailed view of stress relief slots similar to those of FIG. 4 in a third embodiment of the present invention.

Referring now to FIG. 7, therein is shown a more detailed view of stress relief slots 710 similar to those of FIG. 4 in a third embodiment of the present invention. A leadframe strip system 702 is similar in structure to the leadframe strip system 302 of FIG. 3. The leadframe strip system 702 can also be used to form the integrated circuit packaging system 100 of FIG. 1. Elements with the same name have the same attribute as in the leadframe strip system 302 unless explicitly described differently below or in the drawings.

Each of the stress relief slots 710 can include a first leg 726 and a second leg 728 with an abutment portion 730 in between. In this example, the example of the stress relief slots 710 is shown in a segmented arc configuration where the first leg 726, the second leg 728, and the abutment portion 730 represent the segments. The first leg 726 and the second leg 728 can be parallel to sides 424 of leadframe units 304. The abutment portion 730 can intersect two of the sides 424 that are adjacent to each other.

The first leg 726, the second leg 728, and the abutment portion 730 can have a first leg width 740, a second leg width 742, and an abutment width 744, respectively. In this example, the first leg width 740, the second leg width 742, and the abutment width 744 are not all equal. At least one of the first leg width 740, the second leg width 742, and the abutment width 744 differs from another.

It has further been discovered that the present invention provides the integrated circuit packaging system 100 with improved reliability. The stress relief slots 710 at a frame corner 712 relieves external stress induced at or near the frame corner 712 of the leadframe strip system 702 that typically results in micro-cracking or cracking at the package corner 112 of FIG. 1. The equal width of the first leg 726, the second leg 728, and the abutment portion 730 allows equal distribution of external forces around the sensitive area of the package corner 112. This equal distribution of external forces may be required depending on the size or thickness of the leadframe strip system 702 or the size of the integrated circuit packaging system 100 such that a portion of the stress relief slots 710 themselves to not become a point of weakness.

Figure 8:
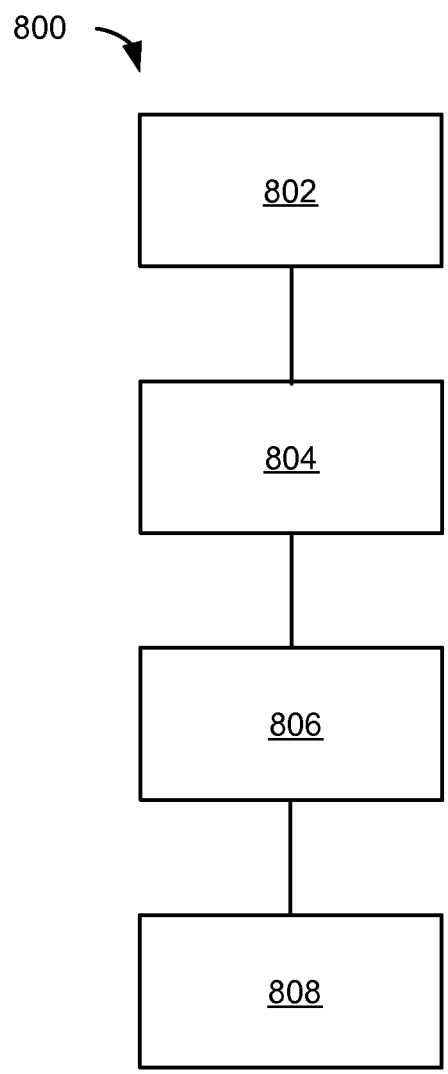
FIG. 8 is a flow chart of a method of manufacture of the integrated circuit packaging system in a further embodiment of the present invention.

Referring now to FIG. 8, therein is shown a flow chart of a method 800 of manufacture of the integrated circuit packaging system 100 in a further embodiment of the present invention. The method 800 includes: providing a leadframe strip system, having a stress relief slot and a leadframe unit, the stress relief slot is at a frame corner of the leadframe strip system and spans adjacent sides of the leadframe unit, the leadframe unit includes a paddle, a tie bar therefrom, and a lead finger in a block 802; connecting an integrated circuit and the lead finger in a block 804; forming an encapsulation covering the integrated circuit in a block 806; and singulating the integrated circuit in the encapsulation from the leadframe strip system with a package corner of the encapsulation free of micro-cracks with an inspection of the package corner at least 50× view in a block 808.

Figure 9:
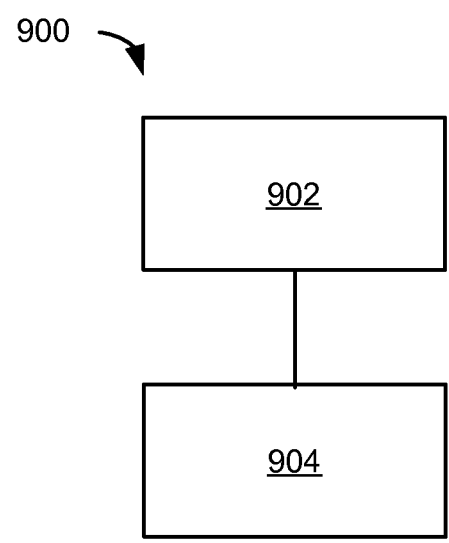
FIG. 9 is a flow chart of a method of manufacture of the leadframe strip system in a further embodiment of the present invention.

Referring now to FIG. 9, therein is shown a flow chart of a method 900 of manufacture of the leadframe strip system 302 in a further embodiment of the present invention. The method 900 includes: forming a leadframe unit at a frame corner, the leadframe unit includes a paddle, a tie bar extending therefrom, and a lead finger in a block 902; and forming a stress relief slot at the frame corner, the stress relief slot spans adjacent sides of the leadframe unit in a block 904.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a stress relief slot with a curved portion and a leadframe unit, the leadframe unit includes a paddle, a tie bar extending from the paddle, and a lead finger beyond a perimeter of the paddle;
   connecting an integrated circuit and the lead finger;
   forming an encapsulation covering the integrated circuit; and
   singulating the integrated circuit in the encapsulation from the leadframe strip system with a package corner of the encapsulation free of micro-cracks as a result the stress relief slot having the curved portion bisected by an axis defined by a centerline of the tie bar and extending from a corner of the paddle to a corner of the leadframe unit for dissipation of external forces away from the package corner by the stress relief slot resulting in zero package crack occurrences.

2. The method as claimed in claim 1 wherein forming the encapsulation includes covering the lead finger.

3. The method as claimed in claim 1 wherein forming the encapsulation includes covering the tie bar.

4. The method as claimed in claim 1 further comprising mounting the integrated circuit over the paddle.

5. The method as claimed in claim 1 further comprising attaching an adhesive to the integrated circuit and the paddle.

6. A method of manufacture of a leadframe strip system comprising:
   forming a leadframe unit at a frame corner, the leadframe unit includes a lead finger, a paddle, and adjacent sides forming a unit corner with a tie bar extending to the paddle; and
   forming a stress relief slot having a first leg, a second leg, and a curved portion therebetween, the curved portion centered with the unit corner directly facing portions of the first leg and the second leg at the unit corner, the first leg and the second leg parallel with the adjacent sides, the curved portion bisected by an axis defined by a centerline of the tie bar extending from the paddle to the unit corner.

7. The method as claimed in claim 6 wherein forming the stress relief slot includes forming the stress relief slot in a segment arc configuration, the stress relief slot having a first leg, a second leg, and an abutment portion including:
   forming the first leg having a first leg width;
   forming the second leg having a second leg width; and
   forming the abutment portion having an abutment width, the first leg width, the second leg width, or the abutment width different from one of the other widths.

8. The method as claimed in claim 6 wherein forming the stress relief slot includes forming the stress relief slot in a segment arc configuration, the stress relief slot having a first leg, a second leg, and an abutment portion including:
   forming the first leg having a first leg width;
   forming the second leg having a second leg width; and
   forming the abutment portion having an abutment width, the first leg width, the second leg width, and the abutment width equal to one another.

9. An integrated circuit packaging system comprising:
   a paddle;
   a tie bar extending from the paddle;
   a lead finger beyond a perimeter of the paddle;
   an integrated circuit connected to the lead finger; and
   an encapsulation covering the integrated circuit with zero package crack occurrences a result of a package corner free of micro-cracks characteristic of molding with a stress relief slot having a curved portion for dissipation of external forces, the curved portion bisected by an axis defined by a centerline of the tie bar and extending from a corner of the paddle to a corner of a leadframe.

10. The system as claimed in claim 9 wherein the encapsulation covers the lead finger.

11. The system as claimed in claim 9 wherein the encapsulation covers the tie bar.

12. The system as claimed in claim 9 wherein the integrated circuit is over the paddle.

13. The system as claimed in claim 9 further comprising an adhesive attached to the integrated circuit and the paddle.

14. A leadframe strip system comprising:
   a frame corner;
   a leadframe unit at the frame corner, the leadframe unit includes a lead finger, a paddle, and adjacent sides forming a unit corner with a tie bar extending to the paddle; and
   a stress relief slot having a first leg, a second leg, and a curved portion therebetween, the curved portion centered with the unit corner directly facing portions of the first leg and the second leg at the unit corner, the first leg and the second leg parallel with the adjacent sides, the curved portion bisected by an axis defined by a centerline of the tie bar extending from the paddle to the unit corner.

15. The system as claimed in claim 14 wherein the stress relief slot is formed in a segment arc configuration, the stress relief slot having a first leg, a second leg, and an abutment portion in between as segments for the segment arc configuration.

16. The system as claimed in claim 14 wherein the stress relief slot is formed in a segment arc configuration, the stress relief slot having a first leg, a second leg, and an abutment portion including:
   the first leg having a first leg width;
   the second leg having a second leg width; and
   the abutment portion having an abutment width, the first leg width, the second leg width, or the abutment width different from one of the other widths.

17. The system as claimed in claim 14 wherein the stress relief slot is formed in a segment arc configuration, the stress relief slot having a first leg, a second leg, and an abutment portion including:
 the first leg having a first leg width;
 the second leg having a second leg width; and
 the abutment portion having an abutment width, the first leg width, the second leg width, and the abutment width equal to one another.

* * * * *